US010523229B2

(12) United States Patent
Dyer

(10) Patent No.: US 10,523,229 B2
(45) Date of Patent: *Dec. 31, 2019

(54) PHASE ADJUSTMENT FOR INTERLEAVED ANALOG TO DIGITAL CONVERTERS

(71) Applicant: Rambus Inc., Sunnyvale, CA (US)

(72) Inventor: Kenneth C. Dyer, Pleasanton, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/227,865

(22) Filed: Dec. 20, 2018

(65) Prior Publication Data

US 2019/0238149 A1 Aug. 1, 2019

Related U.S. Application Data

(63) Continuation of application No. 15/823,355, filed on Nov. 27, 2017, now Pat. No. 10,177,778.

(Continued)

(51) Int. Cl.
*H03M 1/12* (2006.01)
*H03M 1/08* (2006.01)
(Continued)

(52) U.S. Cl.
CPC ........... *H03M 1/1255* (2013.01); *H03M 1/06* (2013.01); *H03M 1/0624* (2013.01);
(Continued)

(58) Field of Classification Search
CPC ............. H03M 1/1255; H03M 1/1215; H03M 1/0836; H03M 1/0673; H03M 1/121; H03M 1/0624
(Continued)

(56) References Cited

U.S. PATENT DOCUMENTS 5,294,926 A 3/1994 Corcoran
7,227,479 B1 6/2007 Chen et al.
(Continued)

FOREIGN PATENT DOCUMENTS

CN 104242933 A 12/2014

OTHER PUBLICATIONS

Jamal, Shafiq et al., "Calibration of Sample-Time Error in a Two-Channel Time-Interleaved Analog-to-Digital Converter", Circuits and Systems I: Regular Papers IEEE Transactions on, vol. 51,ISSN 1549-8328, Jan. 2004, pp. 130-139. 10 Pages.

(Continued)

*Primary Examiner* — Khai M Nguyen
(74) *Attorney, Agent, or Firm* — Fenwick & West LLP

(57) ABSTRACT

An apparatus comprising M time-interleaved analog to digital converters (ADC) that sample an input signal at M sampling phases, wherein M is equal to or greater than 4. A phase control circuit adjusts at least M−1 sampling phases of the M sampling phases. The phase control circuit comprises M−1 phase error detector circuits. Each phase error detector circuit detects a corresponding phase error for a corresponding sampling phase of the M−1 sampling phases based on a sample captured at a sampling phase of the M sampling phases immediately preceding the corresponding sampling phase and a sample captured at a sampling phase of the M sampling phases immediately subsequent to the corresponding sampling phase.

20 Claims, 6 Drawing Sheets

Related U.S. Application Data

(60) Provisional application No. 62/489,852, filed on Apr. 25, 2017, provisional application No. 62/433,198, filed on Dec. 12, 2016.

(51) Int. Cl.
  *H03M 1/06* (2006.01)
  *H03M 1/10* (2006.01)

(52) U.S. Cl.
  CPC .......... *H03M 1/0673* (2013.01); *H03M 1/08* (2013.01); *H03M 1/0836* (2013.01); *H03M 1/1028* (2013.01); *H03M 1/1057* (2013.01); *H03M 1/12* (2013.01); *H03M 1/1215* (2013.01)

(58) Field of Classification Search
  USPC .................................................. 341/118, 155
  See application file for complete search history.

(56) References Cited

U.S. PATENT DOCUMENTS

| | | | | |
|---|---|---|---|---|
| 7,961,123 B2* | 6/2011 | Nagarajan | ........... | H03M 1/1057 341/118 |
| 8,159,377 B2* | 4/2012 | Goldman | ............ | H03M 1/0624 341/118 |
| 8,558,725 B2 | 10/2013 | Kidambi | | |
| 8,604,952 B2* | 12/2013 | Kidambi | ............. | H03M 1/0604 341/118 |
| 8,749,410 B1 | 6/2014 | Van Der Goes et al. | | |
| 8,917,125 B1 | 12/2014 | Waltari | | |
| 9,000,962 B1 | 4/2015 | Leuciuc | | |
| 9,030,341 B2* | 5/2015 | Tan | ..................... | H03M 1/1052 341/118 |
| 9,154,147 B2* | 10/2015 | Biallais | ................... | H03M 1/08 |
| 9,270,291 B1 | 2/2016 | Parnaby et al. | | |
| 9,287,889 B2 | 3/2016 | Chiu et al. | | |
| 9,294,112 B1 | 3/2016 | Devarajan et al. | | |
| 9,401,726 B2* | 7/2016 | Ragab | ................. | H03M 1/0626 |
| 2016/0033309 A1 | 2/2016 | Peeters Weem et al. | | |

OTHER PUBLICATIONS

Jamal, Shafiq M. et al., "A 10-B 120-Msample/s Time-Interleaved Analog-to-Digital Converter With Digital Background Calibration", IEEE Journal of Solid-State Circuits, vol. 37, No. 12, pp. 1618-1627, Dec. 2002. 10 Pages.

Kang, Hyun-Wook et al., "A Sign-Equality-Based Background Timing-Mismatch Calibration Algorithm for Time-Interleaved ADCs", Circuits and Systems II: Express Briefs IEEE Transactions on, vol. 63, ISSN 1549-7747, Jun. 2016, pp. 518-522. 5 Pages.

Razavi, Behzad, "Design Considerations for Interleaved ADCs", Solid-State Circuits IEEE Journal of, vol. 48, ISSN 0018-9200, Aug. 2013, pp. 1806-1817. 12 Pages.

Wei, Hegong et al., "An 8 Bit 4 GS/s 120 mW CMOS ADC", IEEE Journal of Solid-State Circuits, vol. 49, No. 8, pp. 1751-1761, Aug. 2014. 11 Pages.

* cited by examiner

PHASE ADJUSTMENT FOR INTERLEAVED ANALOG TO DIGITAL CONVERTERS

CROSS REFERENCE TO RELATED APPLICATIONS

This application is a continuation of U.S. patent application Ser. No. 15/823,355 filed on Nov. 27, 2017 which claims the benefit of U.S. Provisional Patent Application No. 62/489,852 filed on Apr. 25, 2017 and U.S. Provisional Patent Application No. 62/433,198 filed on Dec. 12, 2016, each of which are incorporated by reference herein in their entirety.

BACKGROUND

In high speed data transmission systems, analog to digital converter (ADC) based receiver solutions are becoming more attractive due to their ability to compensate for higher channel loss. To reduce power while enabling an effectively high ADC conversion rate, the receiver can use multiple ADC channels that are time-interleaved. The accuracy of the interleaved ADC can be affected by imperfections in the sampling phases of the interleaved ADC channels.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1:
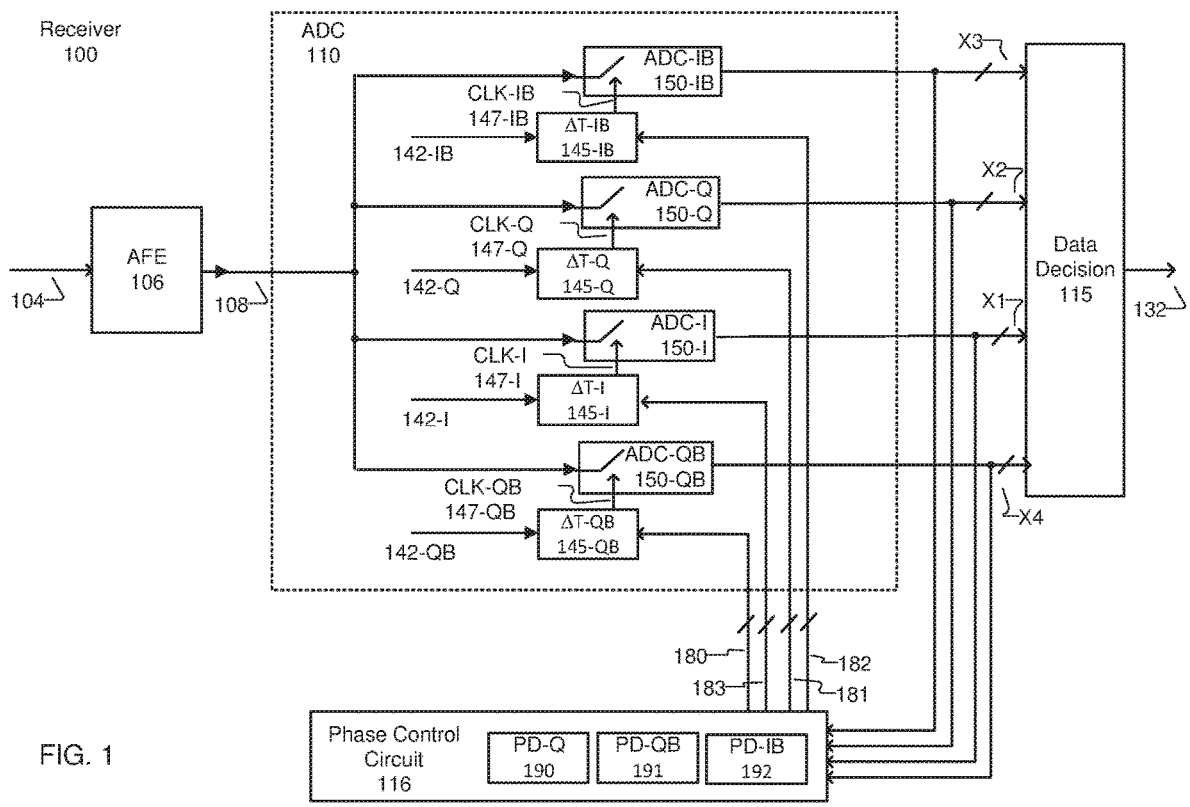
FIG. 1 is high-speed receiver, according to an embodiment of the present disclosure.

Figure (FIG. 1 is a receiver 100 with an ADC circuit 110, according to an embodiment of the present disclosure. The receiver 100 may be found on-chip in an apparatus such as an integrated circuit (IC). The receiver 100 may the receiver portion of a high speed transceiver. The receiver 100 receives an analog input signal 104 from a remote transmitter via a serial communication channel, and converts the differential input signal 104 into digital data 132. In some embodiments the analog input signal 104 can be a single ended or differential signal. The receiver 100 includes an analog front end AFE circuit 106, ADC circuit 110, a data decision circuit 115, and a phase control circuit 116.

The AFE circuit 106 includes circuits that perform various signal conditioning functions on the analog input signal 104. The AFE circuit 106 can adjust the gain of the analog input signal 104, adjust a DC offset of the analog input signal 104, and/or apply continue time linear equalization to the analog input signal 104. The AFE circuit 106 generates a conditioned analog input signal 108 as a result of these signal conditioning functions.

The ADC 110 repeatedly converts the conditioned analog input signal 108 into multi-bit digital samples X1, X2, X3 and X4. The ADC 110 includes multiple time-interleaved ADCs 150. In one embodiment, each ADC 150 is a successive approximation register (SAR) ADC. In other embodiments other ADC architectures can be used for an ADC 150. In one embodiment, the ADCs 150 have matching gain and offset, or the ADCs 150 can be calibrated to have matching gain and offset.

Each ADC 150 includes its own sample and hold amplifier (SHA). The switches at the inputs of the ADCs 150 represent the sampling switches of the SHAs. The ADCs 150 use their respective SHAs to sample a voltage of the conditioned analog input signal 108 at the same sampling frequency. However, each ADC samples the conditioned analog input signal 108 at a different sampling phase. ADC-I is an in-phase ADC that samples the input signal 108 at a zero degree phase, and then convers the analog voltage samples into digital samples X1. ADC-Q is a quadrature phase ADC that samples the input signal 108 at a quadrature (90 degree) phase, and then convers the analog voltage samples into digital samples X2. ADC-IB is an anti-phase ADC that samples the input signal 108 at an anti-phase (180 degree), and then convers the analog voltage samples into digital samples X3. ADC-QB is an anti-quadrature ADC that samples the input signal 108 at an anti-quadrature (270 degree) phase, and then convers the analog voltage samples into digital samples X4.

For each ADC 150, a clock delay circuit 145 generates a sampling clock signal 147 that controls the sampling phase of the ADC 150. Each clock delay circuit 145 receives its own reference clock signal 142 and adjusts a phase delay between the reference clock signal 142 and its sampling clock signal 147. The amount of the phase delay is controlled by phase delay settings 180, 181 and 182 received from the phase control circuit 116.

Ideally, the sampling clock signals 147 should have the same frequency, and the phase offset from one sampling clock signal 147 to the next should be the same. Sampling clock signal 147-I should have a 0 degree phase offset, sampling clock signal 147-Q should have a 90 degree phase offset, sampling clock signal 147-IB should have a 180 degree phase offset, and sampling clock signal 147-QB should have a 270 degree phase offset. However, due to variations in temperature, process, and imperfections in the receiver 100, the phase offset from one sampling clock signal 147 to the next may not always be exactly 90 degrees, but may be substantially equal to 90 degrees. In one embodiment, a phase or phase offset is substantially equal to a certain value if it is within 10% of that value. The clock delay circuits 145 allow for adjustment in the phase offsets so that the sampling clock signals 147 are adjusted closer to their ideal phase offsets.

Clock delay circuit 145-I adjusts a phase delay of sampling clock signal CLK-I 147-I relative to reference clock signal 142-I. Clock delay circuit 145-Q adjusts a phase delay of sampling clock signal CLK-Q 147-Q relative to reference clock signal 142-Q. Clock delay circuit 145-IB adjusts a phase delay of sampling clock signal CLK-IB 147-IB relative to reference clock signal 142-IB. Clock delay circuit 145-QB adjusts a phase delay of sampling clock signal CLK-QB 147-QB relative to reference clock signal 142-QB.

The amount of the phase delay is set by phase delay settings 180, 181, 182, and 183 provided to the clock delay circuits 145-QB, 145-Q, 145-IB, and 145-I respectively. Sampling clock signal CLK-I 147-I is typically set to a reference phase via phase delay setting 183. The phase control circuit 116 then uses feedback from the digital samples X1-X4 to iteratively adjust and refine the phase delay settings 180, 181 and 182. By adjusting the phase delay settings 180, 181, 182 and 183, the phases of the sampling clocks 147 and therefore the sampling phases of the ADCs 150 are adjusted to eliminate inaccuracies in the sampling phases.

The phase control circuit 116 uses three different phase error detector circuits PD 190, 191 and 192 to detect phase errors in sampling phases of three out of the four ADCs 150. A phase error detector PD-Q 190 detects a phase error in the sampling phase of ADC-Q. A phase error detector PD-QB 191 detects a phase error in the sampling phase of ADC-QB. A phase error detector PD-IB 192 detects a phase error in the sampling phase of ADC-IB.

In some embodiments the clock delay circuits 145 may be considered to be part of the phase control circuit 116. In some embodiments, portions of the phase control circuit 116 may be located off-chip on a separate IC chip. FIG. 1 illustrates a system with M number of time-interleaved ADCs 150, and M−1 phase detectors 190, 191 and 192, where M equals four. In other embodiments there may a different number of ADCs 150 or phase detectors 190, 191 and 192.

The data decision circuit 115 receives the digital samples X1-X4 and makes a decision on what digital data is represented by the digital samples. The data decision circuit 115 then outputs digital data 132 representing the decision. For example, the data decision circuit 115 can make a decision on whether each digital sample X1-X4 represents a data value of binary 1 or binary 0 or a PAM 4 value of 00, 10, 11 or 11. An example of a data decision circuit 115 is a digital signal processor (DSP). The DSP can implement various decision algorithms for processing the digital samples.

The operation of the phase control circuit 116 in adjusting the sampling phases of the time-interleaved ADCs 150 will now be described. The high-level operation of the phase control circuit 116 will first be described by reference to FIG. 2 and FIG. 3. The detailed circuits and operation of the phase control circuit 116 will then be described by reference to FIG. 4 and FIG. 5.

Figure 2:
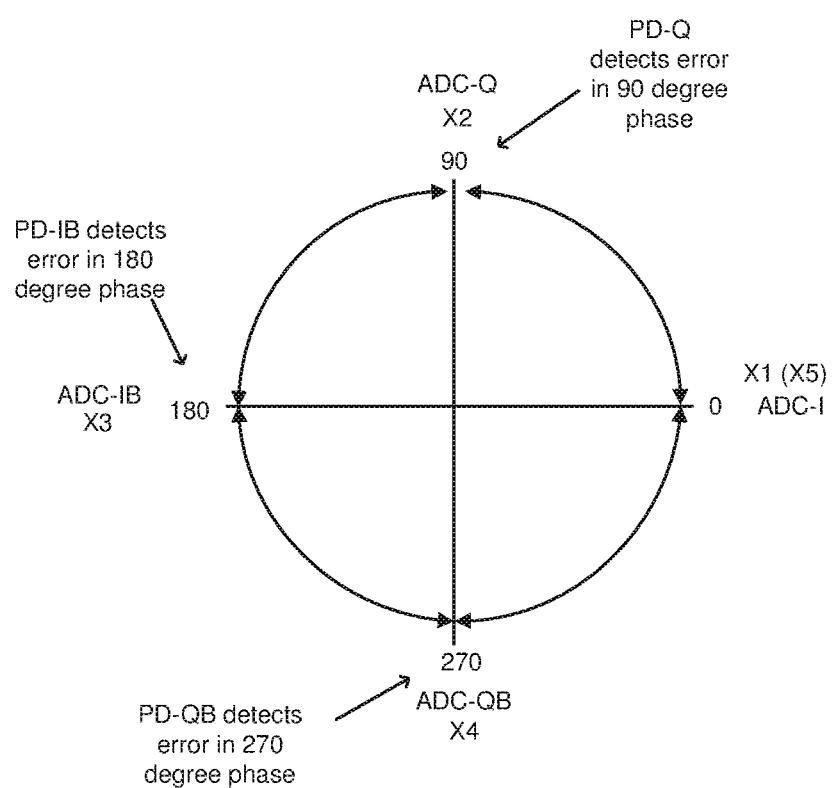
FIG. 2 is a phase diagram for the time-interleaved ADCs of FIG. 1, according to an embodiment.

Referring to FIG. 2, illustrated is a phase diagram for the time-interleaved ADCs 150 of FIG. 1, according to an embodiment. ADC-I has a sampling phase of 0 degrees and generates a sequence of digital samples X1 for multiple sampling cycles. ADC-Q has a sampling phase of 90 degrees and generates a sequence of digital samples X2 for multiple sampling cycles. ADC-IB has a sampling phase of 180 degrees and generates a sequence of digital samples X3 for multiple sampling cycles. ADC-QB has a sampling phase of 270 degrees and generates a sequence of digital samples X4 for multiple sampling cycles. Also shown is X5, which represents another sample captured by ADC-I at a sampling phase of 360 degrees. Digital sample X5 is equivalent to digital sample X1 captured at a sampling phase of 0 degrees at the beginning of the next sampling cycle.

Each sampling phase is immediately adjacent to two other sampling phases in the phase diagram. The 90 degree sampling phase is immediately adjacent to the 0 degree and 180 degree sampling phases. The 180 degree sampling phase is immediately adjacent to the 90 degree and 270 degree sampling phases. The 270 degree sampling phase is immediately adjacent to the 180 degree and 0 degree (i.e. the 360 degree) sampling phases.

Each phase error detector PD-Q, PD-QB, and PD-IB adjusts the sampling phase of a corresponding ADC 150 using samples captured at the sampling phase of the corresponding ADC 150, samples captured at the immediately subsequent sampling phase of another ADC 150, and samples captured at the immediately preceding sampling phase of another ADC 150. For example, phase error detector PD-Q detects a phase error in the sampling phase of ADC-Q from samples X1, X2 and X3. Phase error detector PD-IB detects a phase error in the sampling phase of ADC-IB from samples X2, X3 and X4. Phase error detector PD-QB detects a phase error in the sampling phase of ADC-QB from samples X3, X4 and X5. This will be explained in greater detail by reference to FIG. 3.

Figure 3:
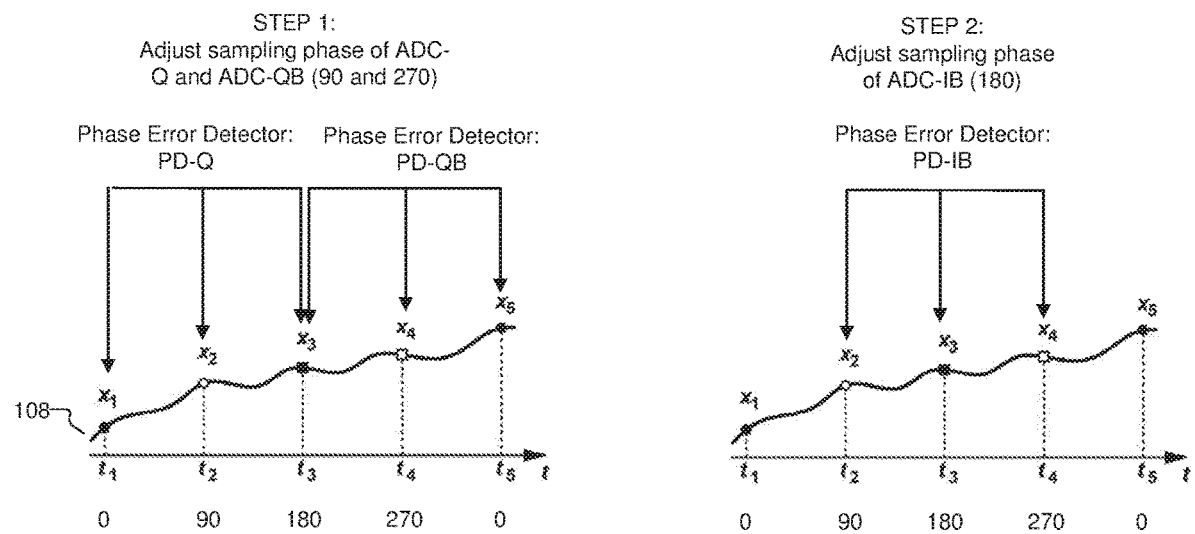
FIG. 3 is a time-based sampling diagram for the time-interleaved ADCs of FIG. 1, according to an embodiment.

Referring to FIG. 3, illustrated is a time-based sampling diagram for the time-interleaved ADCs 150 of FIG. 1, according to an embodiment. The x axis is time, and the y axis is voltage or sample level. A waveform of the conditioned analog input signal 108 increases over time. The conditioned analog input signal 180 is sampled at adjacent 90 degree phase intervals by the ADCs 150, which results in digital samples of X1, X2, X3, X4 and X5 during a sampling cycle.

In step 1, the phase error in the Q (90 degree) sampling phase of ADC-Q is detected with phase error-detector PD-Q, and the phase error in the QB (270 degree) sampling phase of ADC-QB is detected with phase error detector PD-QB. The sampling phases of ADC-Q and ADC-QB are then adjusted to reduce the phase errors. In step 2, the phase error in the IB (180 degree) sampling phase of ADC-IB is then detected with phase-error detector PD-QB, and the sampling phase of ADC-IB is adjusted. Step 1 and step 2 are iteratively repeated multiple times until convergence is reached.

To detect a phase error in the Q (90 degree) sampling phase, phase error detector PD-Q performs the following computation: |X2−X1|−|X3−X2|. This calculation is performed many times over many samples, and the calculations are averaged. The averaged value is proportional to and represents a phase error in the sampling phase of ADC-Q. The sampling phase of ADC-Q is adjusted based on the phase error calculation.

To detect a phase error in the QB (270 degree) sampling phase, phase error detector PD-QB performs the following computation: |X4−X3|−|X5−X4|. This calculation is performed many times over many samples, and the calculations are averaged. The averaged value proportional to and represents a phase error in the sampling phase of ADC-QB. The sampling phase of ADQ-QB is adjusted based on the phase error calculation.

To detect a phase error in the IB (180 degree) sampling phase, phase error detector PD-IB performs the following computation: |X3−X2|−|X4−X3|. This calculation is performed many times over many samples, and the calculations are averaged. The averaged value is proportional to and represents a phase error in the sampling phase of ADC-IB. The sampling phase of ADC-IB is adjusted based on the phase error calculation.

The differences between sample levels of samples captured at adjacent phases can be used as an indicator of phase error. When a large number of samples of the conditioned input signal 108 are collected, on average it is expected that the change in magnitude from one sample to the next should be identical if the sampling phases are equally spaced from each other. Statistically speaking, an approximation of the derivative of the autocorrelation function between the adjacent samples is analyzed.

Each of the phase error detectors PD-Q, PD-QB, and PD-IB thus performs the phase error computation using input samples from immediately adjacent pairs of sampling phases. The phase error detectors PD-Q, PD-QB, and PD-IB do not skip immediately adjacent phase samples when performing their phase error calculations. For example, phase error PD-IB computes the phase error in the 180 degree sampling phase of ADC-IB using input samples X2, X3 and X4, instead of performing the calculation using input samples X1, X3 and X5 and skipping samples X2 and X4. Simulation results have shown that, by computing the phase error for ADC-IB using the differences between immediately adjacent pairs of phase samples (e.g. between X2 and X3, between X3 and X4), the sampling phase for ADC-IB is able to converge to the proper sampling phase at input frequencies up to Fs/2. Fs is the overall sampling frequency rate of the ADC 110 and each individual ADC 150 samples at a rate of Fs/4. By contrast, if the phase error calculation for ADC-IB is performed using input samples X1, X3 and X5, the sampling phase for ADC-IB only converges at input frequencies up to Fs/4.

The phase error detectors PD-Q, PD-QB, and PD-IB also detect errors using hardware reduced autocorrelation, which approximates errors using absolute-value operations instead of using any multipliers. This reduces the power consumed by the phase error detectors PD-Q, PD-QB, and PD-IB when computing the phase errors. Hardware reduced autocorrelation can also reduce latency and die area in addition to reducing power consumption. Large digital cells are pipelined and can increase receiver latency, reducing timing recovery tracking bandwidth.

Figure 4:
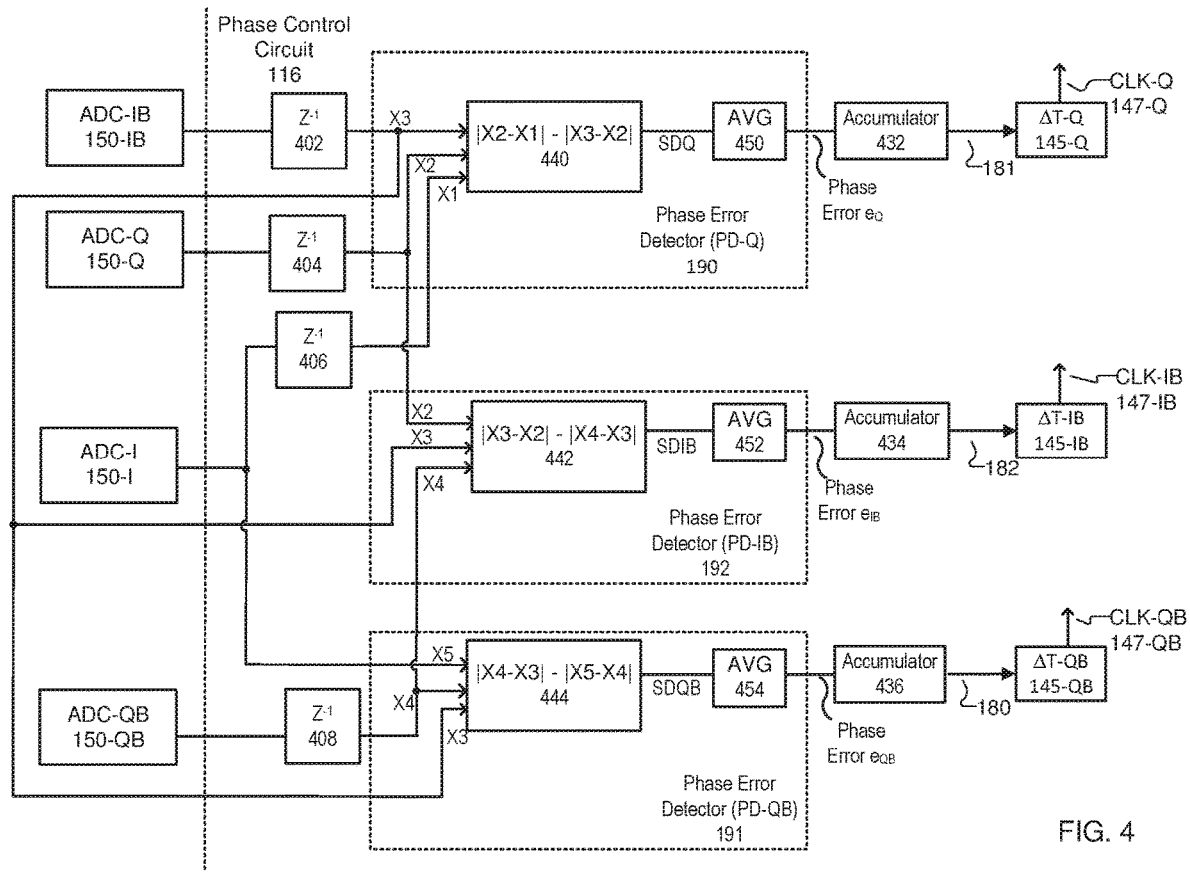
FIG. 4 is a diagram illustrating the circuits within the phase control circuit, according to an embodiment.

FIG. 4 is a diagram illustrating the circuits within the phase control circuit 116, according to an embodiment. The phase control circuit 116 includes sample registers 402, 404, 406, 408, phase error detectors PD-Q 190, PD-IB 192, and PD-QB 191 and error accumulators 432, 434, 436. Each of the blocks shown in FIG. 4 can be implemented with circuits. In addition, each of the lines between the blocks can be a parallel signaling path through which multiple bits are carried in parallel at the same time.

Each sample register 402, 404, 406 and 408 holds the value of a corresponding digital sample for period of time that is equal to 4/Fs. Sample register 402 stores a digital sample X3 from ADC-IB. Sample register 404 stores a digital sample X2 from ADC-Q. Sample register 406 stores a digital sample X1 from ADC-I. Sample register 408 stores a digital sample X4 from ADC-QB. New samples are stored in the registers 402, 404, 406, 408 at periodic intervals.

Phase error detector PD-Q determines a phase error $e_Q$ that represents the phase error in the sampling phase of ADC-Q. Phase error detector PD-Q 190 includes a difference calculation circuit 440 and an averaging circuit 450.

Difference calculation circuit 440 performs the calculation of SDQ=|X2−X1|−|X3-X2|. In specific, the difference calculation circuit 440 calculates the absolute value of the difference between digital samples X2 and X1. The difference calculation circuit 440 also calculates the absolute value of the difference between digital samples X3 and X2. The difference calculation circuit 440 then calculates the difference between these two absolute values, which results in the generation of the sample difference parameter SDQ. The sample difference calculation circuit 440 can be implemented with summer circuits and absolute value circuits.

The averaging circuit 450 collects a large number of sample difference parameters SDQ and averages the sample difference parameters SDQ. The average is then output as the phase error $e_Q$. For example, the difference calculation circuit 440 can calculate sample difference parameter SDQ 4096 times over 4096 different sets of samples X1, X2 and X3. The 4096 different sample difference parameters SDQ are then averaged to generate the phase error $e_Q$. In other embodiments, sample difference parameter SDQ can be calculated more than 4096 times or less than 4096 times. The number of calculations can be increased to increase accuracy at cost of slowing the convergence.

Phase error detector PD-QB 191 determines a phase error $e_{QB}$ that represents the phase error in the sampling phase of ADC-QB. Phase error detector PD-QB 191 includes a difference calculation circuit 444 and an averaging circuit 454.

Difference calculation circuit 444 performs the calculation of SDQB=|X4−X3|−|X5−X4|. In specific, the difference calculation circuit 444 calculates the absolute value of the difference between digital samples X4 and X3. The difference calculation circuit 444 also calculates the absolute value of the difference between digital samples X5 and X4. The difference calculation circuit 444 then calculates the difference between these two absolute values, which results in the generation of the sample difference parameter SDQB. The sample difference calculation circuit 444 can be implemented with summer circuits and absolute value circuits.

The averaging circuit 454 collects a large number of sample difference parameters SDQB and averages the sample difference parameters SDQB. The average is then output as the phase error $e_{QB}$. For example, the difference calculation circuit 444 can calculate sample difference parameter SDQB 4096 times over 4096 different sets of samples X3, X4 and X5. The 4096 different sample difference parameters SDQB are then averaged to generate the phase error $e_{QB}$.

Phase error detector PD-IB 192 determines a phase error $e_{IB}$ that represents the sampling phase error in the sampling phase of ADC-IB. Phase error detector PD-IB 192 includes a difference calculation circuit 442 and an averaging circuit 452.

Difference calculation circuit 442 performs the calculation of SDIB=|X3−X2|−|X4-X3|. In specific, the difference calculation circuit 442 calculates the absolute value of the difference between digital samples X3 and X2. The difference calculation circuit 440 also calculates the absolute value of the difference between digital samples X4 and X3. The difference calculation circuit 442 then calculates the difference between these two absolute values, which results in the generation of the sample difference parameter SDIB. The sample difference calculation circuit 442 can be implemented with summer circuits and absolute value circuits.

The averaging circuit 452 collects a large number of sample difference parameters SDQ and averages the sample difference parameters SDQ. The average is then output as the phase error $e_{IB}$. For example, the difference calculation circuit 442 can calculate sample difference parameter SDIB 4096 times over 4096 different sets of samples X2, X3 and X4. The 4096 different sample difference parameters SDIB are then averaged to generate the phase error em.

Each accumulator circuit 432, 434, and 436 stores its own multi-bit accumulated value (e.g. a 16-18 bit value or a different number of bits) that is updated using a corresponding phase error $e_Q$, $e_{IB}$ or $e_{QB}$. The initial value of each accumulator circuit 432, 434 and 436 can be set to a pre-determined startup value, which is then updated using the value of a corresponding phase error $e_Q$, $e_{IB}$ or $e_{QB}$. In one embodiment, if the accumulated value is a 16 bit value, the most significant 6 bits of each accumulated value can be set to a pre-determined startup value.

Each accumulator circuit 432, 434, and 436 receives a corresponding phase error $e_Q$, $e_{IB}$ or $e_{QB}$. Each phase error $e_Q$, $e_{IB}$ or $e_{QB}$ is a multi-bit value that can be negative or positive. Each accumulator circuit 432, 434, and 436 performs a signum operation on the corresponding phase error $e_Q$, $e_{IB}$ or $e_{QB}$ to identify whether the phase error is a positive or negative value. The accumulated value can be incremented or decremented by a fixed value (e.g. +1, −1) depending on whether the corresponding phase error $e_Q$, $e_{IB}$ or $e_{QB}$ is positive or negative.

In one embodiment, each accumulator circuit 432, 434, and 436 can simply add the full phase error value $e_Q$, $e_{IB}$ or $e_{QB}$ to the current accumulated value instead of incrementing or decrementing the accumulated value by a fixed value. In another embodiment, there can be a gain factor circuit at the input to each accumulator circuit 432, 434, and 436 that scales up or scales down the corresponding phase error $e_Q$, $e_{IB}$ or $e_{QB}$ value. The gain adjusted phase error value is then added to the current accumulated value.

In one embodiment, each accumulator circuit 432, 434, and 436 compares the absolute value of the corresponding phase error $e_Q$, $e_{IB}$ or $e_{QB}$ to a threshold. If the threshold is not exceeded, the accumulated value is not updated and is maintained at its current value. This allows small phase errors $e_Q$, $e_{IB}$ or $e_{QB}$ to be disregarded.

Each accumulator circuit 432, 434 and 436 generates a corresponding phase delay setting 181, 182 and 180 based on the accumulated value stored in the accumulator circuit 432, 434 and 436. In one embodiment, each phase delay setting 181, 182, 180 is copied from the top six most significant bits of an accumulated value. The phase delay settings 181, 182 and 180 are provided to their corresponding clock delay circuits 145-Q, 145-IB and 145-QB, which results in the adjustment of the ADC 150 sampling phases.

Figure 5:
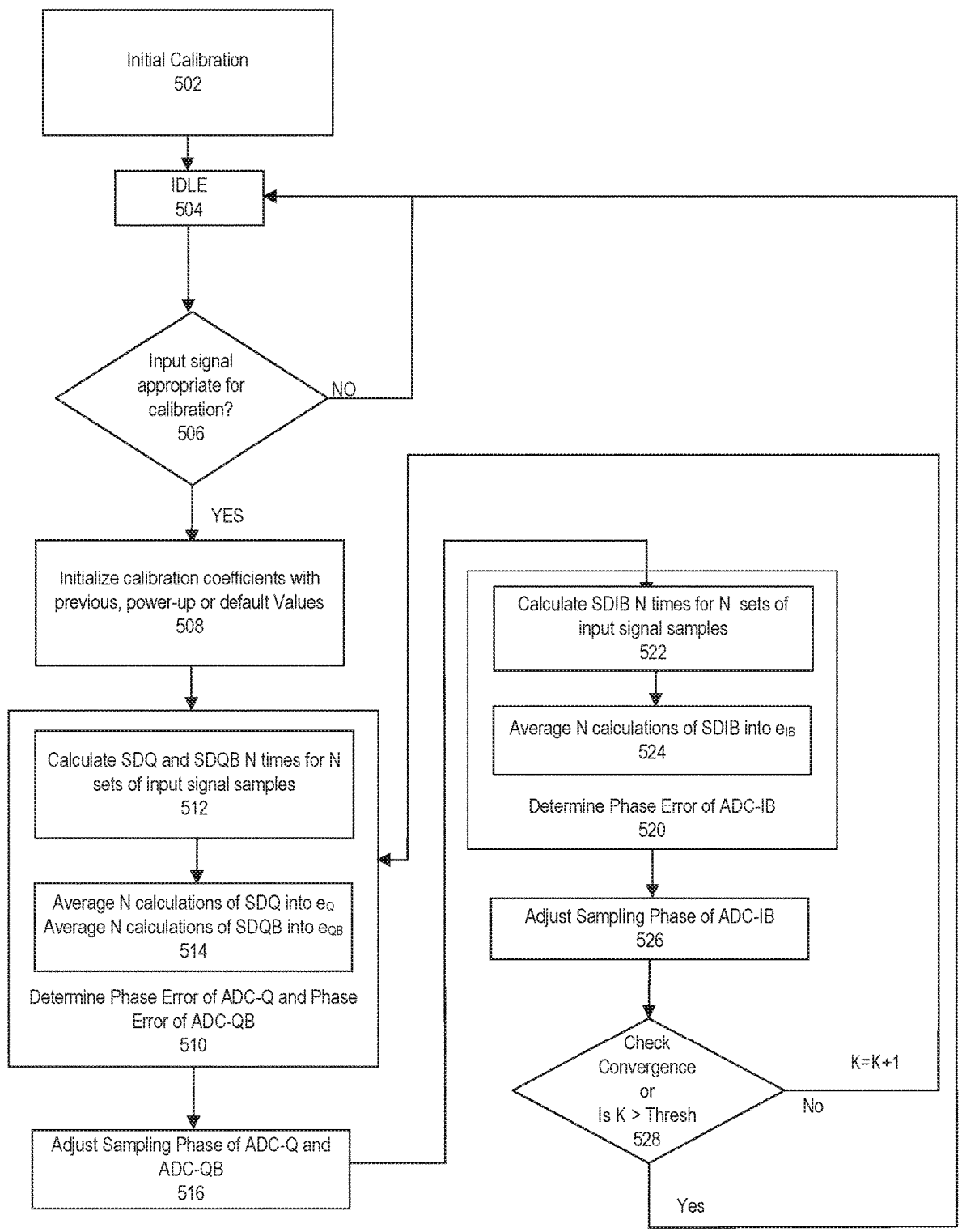
FIG. 5 is a flowchart illustrating a method of operation in the receiver, according to an embodiment.

FIG. 5 is a flowchart illustrating a method of operation in the receiver 100, according to an embodiment. In step 502, initial calibration of the receiver is performed. The initial calibration can include calibration of the gain and offset of the AFE 106. The initial calibration can also setting the phase delay settings 180-182 to pre-determined startup values.

In step 504, the phase control circuit 116 is in an idle state. Data may be transmitted by a remote transmitter and received as an analog input signal 104 at the input to the receiver 100 while the phase control circuit 116 is in an idle state. Also, the data decision circuit 115 may be active and making data decisions from the digital samples. Periodic calibration of the ADC sampling phases, explained by reference to the remainder of the flowchart, occurs while the analog input signal 104 is being received at the receiver 100 and while the data decision circuit 115 is actively making data decisions from the digital samples.

In step 506, the phase control circuit 116 determines whether the analog input signal 104 is the type of signal that is appropriate for periodic sampling phase calibration. For example, the phase control circuit 116 can determine if the analog input signal 104 is clipping, whether the analog input signal 104 has a sufficient number of data transitions, and whether the peak-to-peak voltage of the analog input signal 104 is above a threshold peak-to-peak voltage. If the input signal 104 is not appropriate for calibration, the process returns to the idle state at step 504. If the input signal 104 is appropriate for calibration, the process proceeds to step 508.

In step 508, the phase control circuit 116 initializes various calibration coefficients and parameters within the phase control circuit 116 to their previous, power up or default values. For example, the accumulated values can be set to a default startup value, or they can be set to their previous values.

Calibration of the sampling phases generally proceeds in two stages. First, the sampling phases of ADC-Q and ADC-QB are calibrated. Second, the sampling phase of ADC-IB is calibrated. These two stages are repeated iteratively until calibration is completed.

In step 510, phase error detector PD-Q detects the phase error of ADC-Q from N sets of input samples captured over N sampling cycles of the ADC 110, while phase error detector PD-QB detects the phase error of ADC-QB from the N sets of input samples. In one embodiment, N is greater than 4096. Phase error detector PD-Q and phase error detector PD-QB detect their respective phase errors concurrently. During step 510 and step 516, the other phase error detector PD-IB is disabled to reduce power consumption.

Step 510 includes several sub-steps. In step 512, phase error detector ADC-Q repeatedly calculates sample difference parameter SDQ N times from input samples X1, X2 and X3 in N sets of input samples. At the same time, phase error detector ADC-QB repeatedly calculates sample difference parameter SDQB N times from input samples X3, X4 and X5 in N sets of input samples. In step 514, the N calculations of SDQ are averaged together to generate the phase error $e_Q$. Additionally, the N calculations of SDQB are averaged together to generate the phase error $e_Q$.

In step 516, the sampling phase of ADC-Q is adjusted based on the phase error $e_Q$, and the sampling phase of ADC-QB is adjusted based on the phase error $e_{QB}$. For example, the accumulator circuits 432 and 436 can update their respective accumulator values, and then output updated phase delay settings 181 and 180 in accordance with the updated accumulator values.

In step 520, phase error detector ADC-IB detects the phase error of ADC-IB from N sets of input samples captured over N sampling cycles of the ADC 110. Different sets of input samples are used during step 512 and step 522. For example, 4096 sets of input samples may be captured and used during step 512. 4096 additional sets of input samples are then captured and used during step 522. During step 520 and step 526, the other phase error detectors PD-Q and PD-QB are disabled to reduce power consumption.

Step 520 includes several sub-steps. In step 522, phase error detector PD-IB repeatedly calculates sample difference parameter SDIB N times from input samples X2, X3 and X4 in N sets of input samples. In step 524, the N calculations of SDIB are averaged together to generate the phase error $e_{IB}$.

In step 526, the sampling phase of ADC-IB is adjusted based on the phase error $e_{IB}$, and the sampling phase of ADC-IB is adjusted based on the phase error $e_{IB}$. For example, the accumulator circuit 434 can update its accumulated value, and then output an updated phase delay setting 182 in accordance with the updated accumulator values.

In step 528 it is determined whether convergence has been reached. In one embodiment, convergence is reached if all of the phase errors $e_Q$, $e_{IB}$ or $e_{QB}$ are below a phase error threshold. In another embodiment, convergence is reached if the phase delay settings 180, 181 and 182 are no longer changing. In step 528, it is also determined if a loop counter K has exceed a threshold number of calibration loops.

If convergence has been reached or the number of calibration loops is greater than the threshold, the calibration is complete and the process returns to step 504. Otherwise, a loop counter K is incremented by one and the process returns to step 510. In other embodiments, the process may return to the idle state at step 504 if other conditions are met. For example, the process may return to the idle state at step 504 if any phase delay setting 180, 181 or 182 has reached its maximum or minimum value.

Two stages are used during calibration because the receiver includes four ADC's with four sampling phases. In other embodiments, if there are more than four ADC's with more than four sampling phases, there may be more than two calibration stages. Generally speaking, if there are M ADC's, there are M−1 phase detectors, and there are M−2 calibration stages. For example, if there are 10 ADCs, there would be 9 phase detectors and 8 calibration stages. The first calibration stage calibrates two sampling phases. The remaining calibration stages advance in a circle around a phase diagram and calibrate one sampling phase at a time. In other embodiments there are less than M−2 calibration stages.

In one embodiment, the phase delay setting 183 can also be adjusted, which causes the phase of sampling clock CLK-I, and therefore the sampling phase of ADC-I, to move forward or backwards. The phase delay setting 183 can be adjusted by a user via an input from an on-chip digital signal processor (DSP), as opposed to being adjusted using a phase detector circuit. The calibration in FIG. 5 is then performed again, which causes the sampling phases of ADC-Q, ADC-I, and ADC-QB to converge on new sampling phases.

Figure 6:
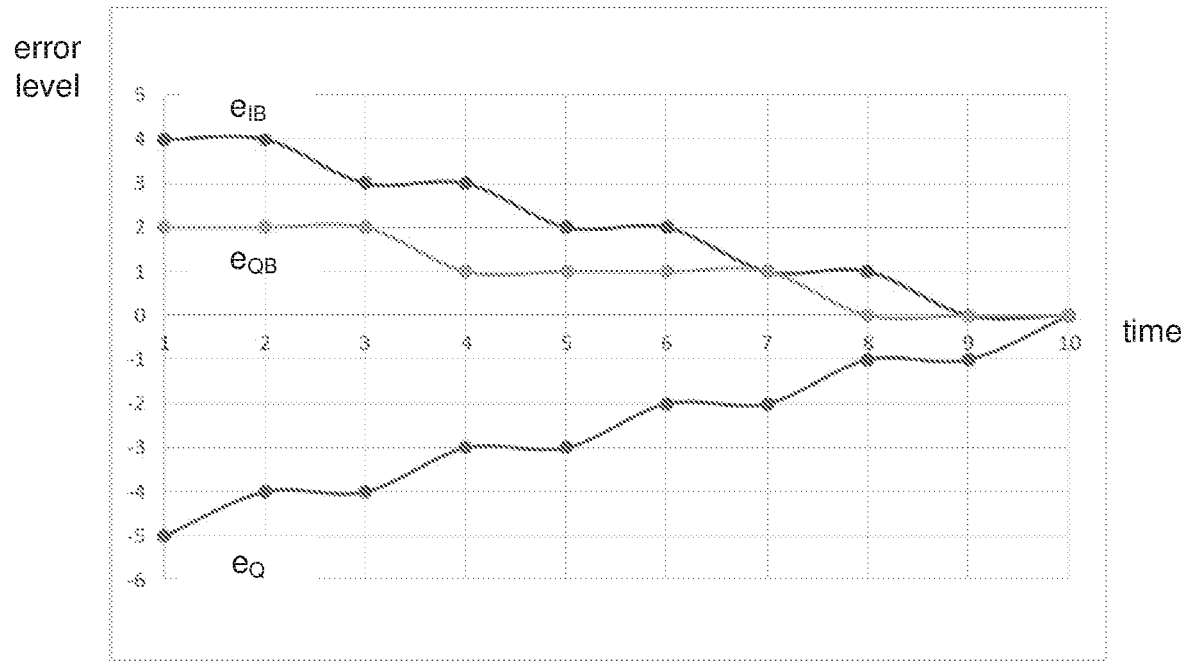
FIG. 6 is a graph illustrating the change in phase error during calibration, according to an embodiment.

FIG. 6 is a graph illustrating the change in phase error during calibration, according to an embodiment. The x axis is time and the y axis is the error level. Initially at time 1, each of the phase errors $e_Q$, $e_{IB}$ or $e_{QB}$ is at a level that indicates the existence of sampling phase error. The phase errors $e_Q$, $e_{IB}$ or $e_{QB}$ decrease over time and eventually reach zero at time 10.

In one embodiment, an apparatus with a receiver comprises M time-interleaved analog to digital converters (ADC) that sample an input signal at M sampling phases. M is an integer that is equal to or greater than 4. A phase control circuit adjusts at least M−1 sampling phases of the M sampling phases. The phase control circuit comprises M−1 phase error detector circuits. Each phase error detector circuit detects a corresponding phase error for a corresponding sampling phase of the M−1 sampling phases based on a sample captured at a sampling phase of the M sampling phases immediately preceding the corresponding sampling phase and a sample captured at a sampling phase of the M sampling phases immediately subsequent to the corresponding sampling phase.

In one embodiment, the M sampling phases includes four sampling phases offset from each other by substantially 90 degrees. The M−1 phase error detectors comprise a first phase error detector circuit to detect a first phase error for a quadrature sampling phase of the M sampling phases. The phase control circuit adjusts the quadrature sampling phase based on the first phase error. A second phase error detector circuit detects a second phase error for an antiphase sampling phase of the M sampling phases. The phase control circuit adjusts the antiphase sampling phase based on the second phase error. A third phase error detector circuit detects a third phase error for an anti-quadrature sampling phase of the M sampling phases. The phase control circuit adjusts the anti-quadrature sampling phase based on the third phase error.

In one embodiment, the second phase error detector circuit detects the second phase error concurrently with the first phase error detector circuit detecting the first phase error. The third phase error detector circuit detects the third phase error after first phase error and the second phase error are detected. In one embodiment, the third phase error detector circuit is disabled while the first phase error detector is detecting the first phase error and the second phase error detector is detecting the second phase error.

In one embodiment, each phase error detector circuit detects the corresponding phase error without using a multiplication circuit.

In one embodiment, each phase error detector circuit detects the corresponding phase error for the corresponding sampling phase by: computing a first absolute value of a difference between a sample captured at the corresponding sampling phase and the sample captured at the sampling phase immediately preceding the corresponding sampling phase;

computing a second absolute value of a difference between the sample captured at the corresponding the corresponding sampling phase and the sample captured at the sampling phase immediately subsequent to the corresponding sampling phase; computing a difference between the first absolute value and the second absolute value; and generating the corresponding phase error based on the difference.

In one embodiment, the phase control circuit also adjusts an Mth sampling phase of the M sampling phases.

In one embodiment, a representation of circuits within the receiver 100 may be stored as data in a non-transitory computer-readable medium (e.g. hard disk drive, flash drive, optical drive). These representations may in the form of, for example, behavioral level descriptions, register transfer level descriptions, logic component level descriptions, transistor level descriptions or layout geometry-level descriptions.

Upon reading this disclosure, those of skill in the art may appreciate still additional alternative designs for a receiver with time-interleaved ADCs. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:

1. An apparatus, comprising:
   a plurality of time-interleaved analog to digital converters (ADC) that sample an input signal at a plurality of sampling phases, the plurality of time-interleaved ADCs including a first ADC that samples an input signal at a first sampling phase, a second ADC that samples the input signal at a second sampling phase, a third ADC that samples the input signal at a third sampling phase, and a fourth ADC that samples the input signal at a fourth sampling phase; and
   a phase control circuit to adjust the plurality of sampling phases, the phase control circuit comprising:
      a plurality of phase error detector circuits including a first phase error detector that detects a phase error of the second sampling phase, a second phase error that detects a phase error of the third sampling phase, and a third phase error detector that detects a phase error of the fourth sampling phase, each of the plurality of phase error detector circuits detecting a corresponding phase error for a corresponding sampling phase of the phase error detector based on a sample captured at a sampling phase immediately preceding the corresponding sampling phase and a sample captured at a sampling phase immediately subsequent to the corresponding sampling phase.

2. The apparatus of claim 1, wherein the first sampling phase, the second sampling phase, the third sampling phase, and the fourth sampling phase are offset from each other by substantially 90 degrees.

3. The apparatus of claim 2, wherein the second sampling phase is a quadrature sampling phase and the first phase error detector adjusts the quadrature sampling phase based on the phase error of the second sampling phase,
wherein the third sampling phase is an antiphase sampling phase and the second phase error detector adjusts the antiphase sampling phase based on the phase error of the third sampling phase, and
wherein the fourth sampling phase is an anti-quadrature sampling phase and the third phase error detector adjusts the anti-quadrature sampling phase based on the phase error of the fourth sampling phase.

4. The apparatus of claim 1, wherein the third phase error detector circuit is disabled while the first phase error detector is detecting the phase error of the second sampling phase and the second phase error detector is detecting the phase error of the third sampling phase.

5. The apparatus of claim 1, wherein each of the plurality of phase error detector circuits detects the corresponding phase error without using a multiplication circuit.

6. The apparatus of claim 1, wherein each of the plurality of phase detector circuits detects the corresponding phase error for the corresponding sampling phase by:
computing a first absolute value of a difference between a sample captured at the corresponding sampling phase and the sample captured at the sampling phase immediately preceding the corresponding sampling phase;
computing a second absolute value of a difference between the sample captured at the corresponding sampling phase and the sample captured at the sampling phase immediately subsequent to the corresponding sampling phase;
computing a difference between the first absolute value and the second absolute value; and
generating the corresponding phase error based on the difference between the first absolute value and the second absolute value.

7. The apparatus of claim 6, wherein each of the plurality of phase detector circuits is further configured to:
generate a plurality of phase errors for a plurality of samples of the input signal at the corresponding sampling phase of the phase detector circuit;
calculates an average of the plurality of phase errors, and
adjust the corresponding sampling phase of the phase detector circuit based on the calculated average.

8. A method comprising:
sampling an input signal at a plurality of sampling phases using a plurality of time-interleaved analog to digital converters (ADC), the plurality of ADCs including a first ADC that samples the input signal at a first sampling phase, a second ADC that samples the input signal at a second sampling phase, a third ADC that samples the input signal at a third sampling phase, and a fourth ADC that samples the input signal at a fourth sampling phase;
detecting a plurality of phase errors of the plurality of sampling phases, the plurality of phase errors including a phase error of the second sampling phase, a phase error of the third sampling phase, and a phase error of the fourth sampling phase, wherein each of the plurality of phase errors is detected by detecting a phase error for a corresponding sampling phase based on a sample captured at a sampling phase immediately preceding the corresponding sampling phase and a sample captured at a sampling phase immediately subsequent to the corresponding sampling phase; and
adjusting each of the plurality of sampling phases based on the detected phase error for the sampling phase.

9. The method of claim 8, wherein the first sampling phase, the second sampling phase, the third sampling phase, and the fourth sampling phase are offset from each other by substantially 90 degrees.

10. The method of claim 9, wherein the second sampling phase is a quadrature sampling phase and the quadrature sampling phase is adjusted based on the phase error of the second sampling phase,
wherein the third sampling phase is an antiphase sampling phase and the antiphase sampling phase is adjusted based on the phase error of the third sampling phase, and
wherein the fourth sampling phase is an anti-quadrature sampling phase and the anti-quadrature sampling phase is adjusted based on the phase error of the fourth sampling phase.

11. The method of claim 8, further comprising:
disabling a first phase error detector circuit that detects the phase error of the fourth sampling phase while a second phase error detector is detecting the phase error of the second sampling phase and a third phase error detector is detecting the phase error of the third sampling phase.

12. The method of claim 8, wherein the phase error for each corresponding sampling phase is detected without using a multiplication circuit.

13. The method of claim 8, wherein detecting the phase error for the corresponding sampling phase comprises:
computing a first absolute value of a difference between a sample captured at the corresponding sampling phase and the sample captured at the sampling phase immediately preceding the corresponding sampling phase;
computing a second absolute value of a difference between the sample captured at the corresponding sampling phase and the sample captured at the sampling phase immediately subsequent to the corresponding sampling phase;
computing a difference between the first absolute value and the second absolute value; and
generating the corresponding phase error based on the difference between the first absolute value and the second absolute value.

14. The method of claim 13, further comprising:
generating a plurality of phase errors for a plurality of samples of the input signal at the corresponding sampling phase;
calculating an average of the plurality of phase errors, and
adjusting the corresponding sampling phase based on the calculated average.

15. A non-transitory computer readable medium storing a representation of a receiver, the receiver comprising:

a plurality of time-interleaved analog to digital converters (ADC) that sample an input signal at a plurality of sampling phases, the plurality of time-interleaved ADCs including a first ADC that samples an input signal at a first sampling phase, a second ADC that samples the input signal at a second sampling phase, a third ADC that samples the input signal at a third sampling phase, and a fourth ADC that samples the input signal at a fourth sampling phase; and a phase control circuit to adjust the plurality of sampling phases, the phase control circuit comprising:

a plurality of phase error detector circuits including a first phase error detector that detects a phase error of the second sampling phase, a second phase error detector that detects a phase error of the third sampling phase, and a third phase error detector that detects a phase error of the fourth sampling phase, each of the plurality of phase error detector circuits detecting a corresponding phase error for a corresponding sampling phase of the phase error detector based on a sample captured at a sampling phase immediately preceding the corresponding sampling phase and a sample captured at a sampling phase immediately subsequent to the corresponding sampling phase.

16. The non-transitory computer readable medium of claim 15, wherein the first sampling phase, the second sampling phase, the third sampling phase, and the fourth sampling phase are offset from each other by substantially 90 degrees.

17. The non-transitory computer readable medium of claim 16, wherein the second sampling phase is a quadrature sampling phase and the first phase error detector adjusts the quadrature sampling phase based on the phase error of the second sampling phase, wherein the third sampling phase is an antiphase sampling phase and the second phase error detector adjusts the antiphase sampling phase based on the phase error of the third sampling phase, and wherein the fourth sampling phase is an anti-quadrature sampling phase and the third phase error detector adjusts the anti-quadrature sampling phase based on the phase error of the fourth sampling phase.

18. The non-transitory computer readable medium of claim 15, wherein the third phase error detector circuit is disabled while the first phase error detector is detecting the phase error of the second sampling phase and the second phase error detector is detecting the phase error of the third sampling phase.

19. The non-transitory computer readable medium of claim 15, wherein each of the plurality of phase error detector circuits detects the corresponding phase error without using a multiplication circuit.

20. The non-transitory computer readable medium of claim 15, wherein each of the plurality of phase detector circuits detects the corresponding phase error for the corresponding sampling phase by:

computing a first absolute value of a difference between a sample captured at the corresponding sampling phase and the sample captured at the sampling phase immediately preceding the corresponding sampling phase;

computing a second absolute value of a difference between the sample captured at the corresponding sampling phase and the sample captured at the sampling phase immediately subsequent to the corresponding sampling phase;

computing a difference between the first absolute value and the second absolute value; and generating the corresponding phase error based on the difference between the first absolute value and the second absolute value.

* * * * *